United States Patent [19]
Hamada

[11] Patent Number: 4,783,767
[45] Date of Patent: Nov. 8, 1988

[54] STATIC RAM WITH DIVIDED WORD-LINE STRUCTURE

[75] Inventor: Minoru Hamada, Ogaki, Japan

[73] Assignee: Sanyo Electric Co., Ltd., Japan

[21] Appl. No.: 872,126

[22] Filed: Jun. 9, 1986

[30] Foreign Application Priority Data

Jun. 14, 1985 [JP] Japan ................. 60-130296

[51] Int. Cl.$^4$ ............................... G11C 7/00
[52] U.S. Cl. ............................ 365/189; 365/226
[58] Field of Search ............ 365/189, 230, 182, 226

[56] References Cited

U.S. PATENT DOCUMENTS 4,542,486  9/1985  Anami et al. ................. 365/230
4,554,646  11/1985  Yoshimoto et al. ............ 365/189

Primary Examiner—Joseph A. Popek
Attorney, Agent, or Firm—Darby & Darby

[57] ABSTRACT

This invention relates to a static random access memory having the so-called divided word-line structure, uses the power supply line also as the common word line so as to enable operation at high speed without causing complication in structure of the wiring layer, resulting in that the manufacturing yield can be improved and a manufacturing coat lowers.

7 Claims, 3 Drawing Sheets

STATIC RAM WITH DIVIDED WORD-LINE STRUCTURE

BACKGROUND OF THE INVENTION

1. Field of the Invention

This invention relates to a static random access memory (SRAM) of a semiconductor memory constructed as an integrated circuit using insulated gate field effect transistors (IG-FET).

2. Description of the Prior Art

The SRAM including as the memory unit a flip-flop circuit using the IG-FET devices has been promoted in the high-speed operation and high integration, however, a signal delay due to resistance in the word-line of memory cells in an array has largely hindered its high-speed operation. The typical IG-FET SRAM at present is of polysilicon gate construction, which connects in common the gates of selecting transistors in the memory cells in the same row so as to form a word-line used for selecting the word direction of the memory cell array. The resistance of polysilicon used as the word-line is 20 to 30$\Omega/\square$, more than 1000 times the value of metallic wirings, thereby creating a signal delay in the word-line, which is a rate limiting factor for the operation of memory.

In order to solve the above problem, one method proposed is that, instead of polysilicon, a low resistance wiring material, such as tungstosilicide be used. This results in the shortcoming that the manufacturing process must be changed following variation in the wiring material, and manufacturing cost becomes high in the manufacturing apparatus and materials.

Another method for solving the above problem is a divided word line (hereinafter referred to as DWL) method. The DWL method is disclosed in the Japanese Patent Publication No. Sho 59-49706 (1984) and also detailed in the "IEEE JOURNAL OF SOLID-STATE CIRCUIT, VOL. SC-18, No. 5", October, 1983. Next, concrete explanation will be given on this method.

FIG. 1 is a circuit diagram of a memory cell in the SRAM, in which two transistors (IG-FETs) $Q_1$ and $Q_2$ (both n-channel type) form a flip-flop, and connect with a power supply line PL between terminals 1 and 2 through load resistances $R_1$ and $R_2$. Transistors $Q_3$ and $Q_4$ (both n-channel type) are selecting transistors and are interposed between terminals 5 and 6 nodes of the transistors $Q_1$ and $Q_2$ with load resistances $R_1$ and $R_2$, and the gates thereof being connected to a word-line WL between terminals 3 and 4.

The power supply line PL and word-line WL connect with adjacent memory cells in the row direction, the power supply line PL concretely comprising a second layer of polysilicon, different from the word-line WL and generally forming the load resistance $R_1$ and $R_2$ due to high resistance at a part of the second layer. In a case where the load resistances $R_1$ and $R_2$ are constituted by the IG-FETs, the power supply line PL may be formed of a diffused layer on a substrate. The terminals 5 and 6 are connected to the adjacent memory cells to constitute the bit line. Generally low resistance metal, such as aluminum is used therefor, because the bit line needs to transmit a faint signal generated by the memory cell.

FIG. 2 is a circuit diagram of the SRAM carrying out the DWL method.

In this circuit, memory cells MC1, MC2 ... MCn, and MCn+1 constructed as shown in FIG. 1 are disposed in array, and in FIG. 2, those in the same row are partially shown. The DWL method is characterized in that the memory cells in array are divided into blocks of plural rows. Reference numerals 21 and 22 designate the block selecting signal lines for selecting each divided block, which lines are connected to NOR circuits 24 and 25 provided at every row in the block respectively.

An inverter 26 comprising two FETs $Q_6$ (p-channel type) and $Q_5$ (n-channel type), forming a part of row selecting circuit, being connected in series with each other. Inverter 26 is connected between the power supply line PL and the grounding conductor and the output of the inverter 26 is connected as the common word line 27 to other input terminals of NOR circuits 24 and 25 of all the blocks in the same row (only two NOR circuits 24 and 25 are shown in FIG. 2, but actually the number of them corresponds to the number of blocks).

The power supply line PL is connected to the terminals 1 and 2 in common with all the blocks. The outputs of NOR circuits 24 and 25 are connected as the word lines to the terminals 3 and 4 at the memory cells in the same row of each block, and the bit lines 23, 23 ... are connected to the terminals 5 and 6 being in common therewith in each row.

Next, explanation will be given on the operation of the circuit shown in FIG. 2. When both the common word line 27 of the outputs of the inverter 26 and the block selecting signal line 21 are at a level "0" and the block selecting signal line 22 is at a level "1", the output of NOR circuit 24 has a level "1", so that the memory cells MC1 and MC2 connected to the output of NOR circuit 24 are selected. Meanwhile, since the block selecting signal line 22 is at a level "1", the output of NOR circuit 25 goes to logical "0", so that memory cells MCn and MCn+1 connected to the word line of the output of the NOR circuit 25 are not selected.

The aforesaid DWL method, in which one circuit in each block is selectively connected to the common word line 27 (in FIG. 2, the NOR circuit 24 or 25), is characterized in that the load is small and the signal delay by the common word line 27 is reduced. Since the word line is divided per block, the DWL method is advantageous in that the word line is small in length, the wiring resistance is small, and the cell selecting transistors $Q_3$ and $Q_4$ to be loaded on the word line function with respect to the memory cells only in the block. Therefore, the load is 1/block in comparison with the conventional word line in common with the entire memory cell array. In brief, the DWL method is less in delay than the common word line and word line method so as to enable high-speed operation.

The DWL method has the aforesaid advantage, but needs the common word line 27 as shown in FIG. 2 in order to demonstrate such advantage.

Generally, this kind of semiconductor memory, such as the SRAM, is disposed on a chip in high density, whereby the wiring material of the common word line 27 cannot be in the same layer as the word line and the power supply line PL and cannot be in the same layer as the bit line 23. Hence, a new wiring layer, such as an aluminum wiring, needs to be provided at the second layer. Therefore, the SRAM has the shortcoming that the manufacturing process is complicated, the yield lower, and the manufacturing cost is high.

SUMMARY OF THE INVENTION

The present invention has been designed to solve the above problem. An object of the invention is to provide a static RAM with a divided word-line structure, which uses the power supply line also as the aforesaid common word line, thereby attaining high-speed operation without causing complication in structure of the wiring layer.

The static random access memory of the invention includes flip-flops arranged as memory cells in array and is characterized in that power supply lines for the flip-flops positioned in the same row are connected in common with each other, a common power supply line is provided on which the voltage is able to assume a logical binary state at least and which is connected to the power supply lines for the flip-flops respectively, and the logical state of the common power supply line is used as a row selecting signal.

The above and further objects and features of the invention will more fully be apparent from the following detailed description with accompanying drawings.

DESCRIPTION OF THE PREFERRED EMBODIMENTS

Next, an embodiment of a static random access memory of the invention will be detailed in accordance with the drawings.

Figure 3:
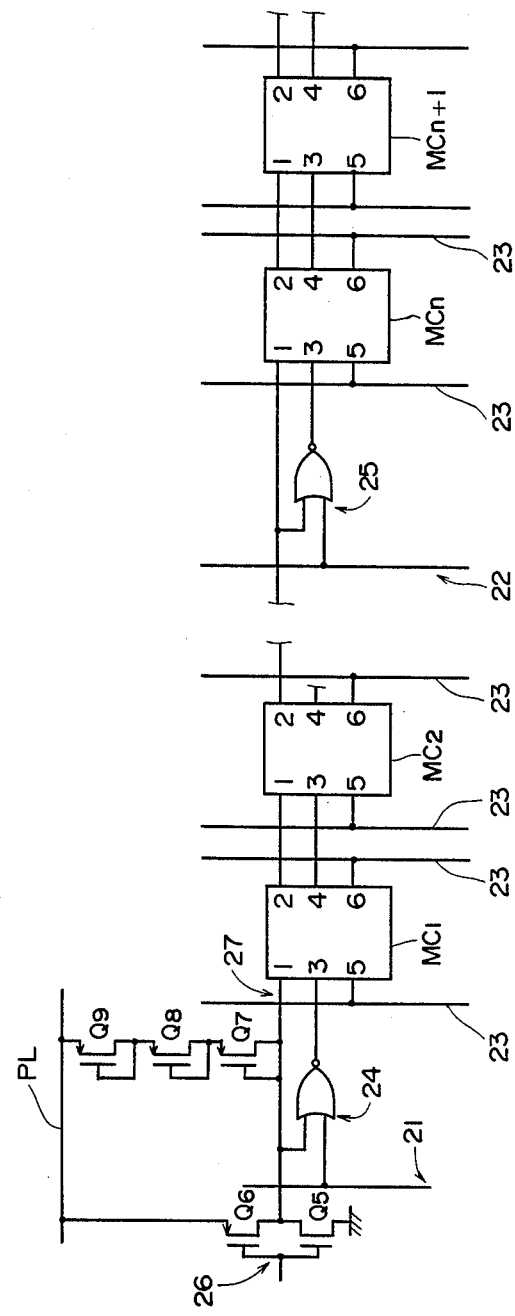
FIGS. 3 and 4 are a circuit diagram of a SRAM structure of the invention, respectively.

FIG. 3 is a circuit diagram showing a part of the SRAM memory cell array in one row, in which memory cell arrays MC1, MC2 ... MCn, MCn+1 are of the same structure as the conventional one shown in FIG. 1. Also, in the circuit of the invention, the memory cell arrays are divided into blocks each having plural columns, and reference numerals 21 and 22 designate the block selecting signal lines, which are connected to NOR circuits 24 and 25 provided at every row of each block.

An inverter 26 comprising two FETs $Q_6$ and $Q_5$ connected in series with each other is connected between a power supply line PL and a grounding conductor. The output of the inverter 26 is connected as the common word line 27 to the other input terminal of the NOR circuits 24 and 25 in all the blocks and, in the circuit of the embodiment, also to terminals 1 and 2 in order to function as the power supply line for the memory cell MC1 in the same row. The outputs of the NOR circuits 24 and 25 are connected as the word line to the terminals 3 and 4 of each memory cell in the same row of each block.

The bit lines 23, 23 ... are connected in common with terminals 5 or 6 of the cell in the same column of each row.

Furthermore, in the circuit of the invention, three transistors (IG-FET) $Q_9$, $Q_8$ and $Q_7$ (all p-channel type) are connected in series between the power supply line PL and the common word line 27, and operate as clamping circuits to be discussed later.

In the above circuitry, the NOR circuits 24 and 25 employ the p-channel and n-channel complementary circuits. The transistors $Q_7$, $Q_8$ and $Q_9$ all are assumed to be p-channel IG-FETs of $-1$ V threshold, and $Q_1$, $Q_2$, $Q_3$ and $Q_4$ are assumed to be n-channel IG-FETs $-1$ V of threshold respectively.

Also, it is assumed that the voltage of the power supply line PL shown in FIG. 3 is 5 V, the NOR circuits 24 and 25 utilize positive logic, the threshold of the input level is 3 V, and the transistors $Q_7$, $Q_8$ and $Q_9$ have gain factors large enough in comparison with the p-channel transistor $Q_5$.

Next, explanation will be given on operation of the SRAM of the invention.

When the input to the inverter 26 is a logical "0", the voltage of the common word line 27 is 5 V and the memory cell MC1 or the like is given a supply voltage of 5 V. Conversely, when the input of the inverter 26 is a logical "1", the transistor $Q_5$ is on, but when voltage of the common word line 27 is under 2 V, the FETs $Q_7$, $Q_8$ and $Q_9$ are on, thereby preventing a voltage drop under that value. In other words, the low level voltage of the common word line 27 is clamped at 2 V.

Figure 1:
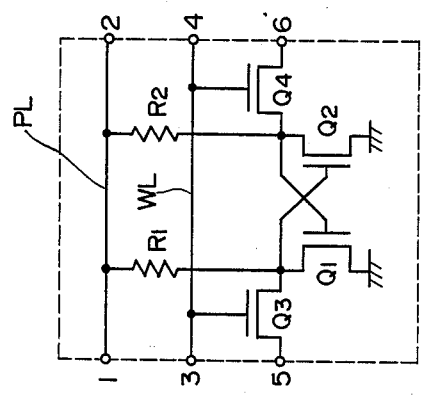
FIG. 1 is a circuit diagram showing a usual SRAM memory cell structure.

In the memory cell shown in FIG. 1, when the load resistances $R_1$ and $R_2$ have resistance value sufficiently larger than that of on-resistances of the transistors $Q_1$ and $Q_2$, the information stored in the memory cell is not broken until the supply voltage for the memory cell drops to the vicinity of the threshold (for example 1 V) of each transistor $Q_1$ or $Q_2$. Accordingly, even when voltage at the common word line 27 drops to 2 V, the memory cell is not hindered in its operation. Furthermore, reading and writing can be operated at high speed in a stabilized manner by selecting properly the characteristics of the transistors $Q_1$ to $Q_4$.

Meanwhile, the NOR circuits 24 and 25 having an input level with a 3 V of the threshold value respectively operate, when voltage of the common word line 27 is 2 V, assuming that the input is a logical "0".

Figure 2:
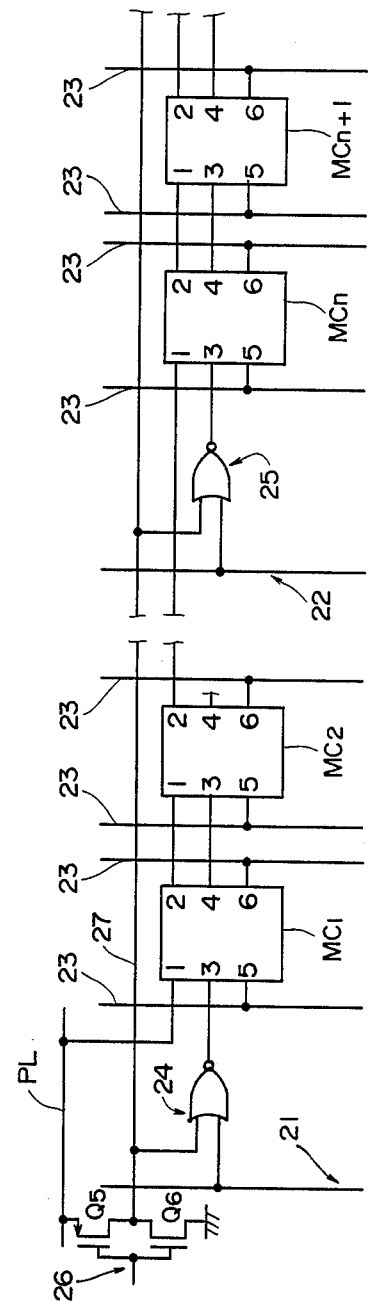
FIG. 2 is a circuit diagram showing the conventional SRAM structure applying the DWL method.

Now, when the common word line 27 is 2 V, the NOR circuit 24, which is given a block selecting signal of logical "0" from the block selecting signal line 21, outputs a logical "1" signal from the output terminal of the circuit 24 and introduces the signal to the terminals 3 and 4 of the memory cells of each block, thereby selecting these cells to function similarly to the SRAM shown in the FIG. 2 circuit diagram.

In the embodiment, the typical resistance-load type memory cells have been described, but the memory cells of applicable to the present invention are CMOS type, in which a low level of the common word line is of a voltage higher than that holdable by the data at the memory cell.

Alternatively, the present invention can be put into practice without using the transistors $Q_7$ to $Q_9$ for clamping voltage on the common word line. In other words, using the resistance-load type memory cell as shown in FIG. 1. Resistances $R_1$ and $R_2$ are usually of about 100GΩ respectively, and the capacity of the node between the resistance $R_1$ (or $R_2$) and the transistor $Q_1$ (or $Q_2$) is about 30 fF, so when the transistors $Q_3$ and $Q_4$ are off, the voltage change at the node has a time constant of about 100 GΩ×30 fF=3 ms. In other words, the high resistance load type memory cell will lose no information even when the supply voltage is 0 V for a time sufficiently less than 3 ms. Accordingly, when the high resistance load type memory cell is used, the word line can be selected while keeping the common word line at 0 V for several ns, at which time the data reading and latching can be completed, and thereafter the common word line can be restored to 5 V.

Figure 4:
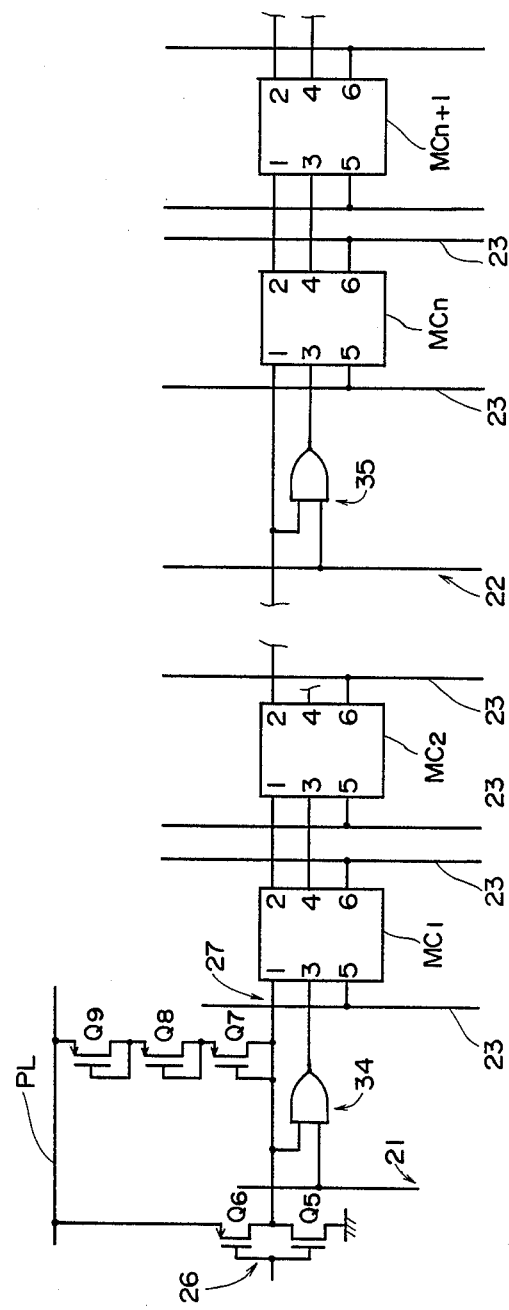

FIG. 4 is a circuit diagram of another embodiment of the SRAM of the invention, in which a part of the memory cell array in one row is shown, as an the above embodiment.

In this embodiment, AND circuits 34, 35 are used instead of NOR circuits 24, 25 of the embodiment shown in above FIG. 3, the rest of the construction being the same.

The operation of the embodiment shown in FIG. 4 is as follows. For example, when both the common word line 27 and the block selecting signal line 21 are logical "1", both the inputs of AND circuit 34 are logical "1", so the output therefrom takes the logical "1". The output of logical "1" of AND circuit 34 is introduced to the terminals 3, 4 of memory cells MC1, MC2, so that these memory cells MC1, MC2 are selected.

But in this case, all the rest of the common word lines are in a state of non-selective ("0"), that is, 2 V, and the transistors $Q_5$, $Q_7$, $Q_8$, and $Q_9$ are all on, thereby the amount of electric current comsumption is somewhat larger than the embodiment shown in above FIG. 3.

As seen from the above, the static RAM of the invention uses the common word line also as the power supply line, thereby requiring no aluminum wiring at the second layer, which was necessary for the conventional circuit shown in FIG. 2. In brief, a SRAM using the DWL method, operative at high speed, and having low power consumption is realizable by a simple manufacturing process and at a high yield.

As this invention may be embodied in several forms without departing from the spirit of essential characteristics thereof, the present embodiments are therefore illustrative and not restrictive. Since the scope of the invention is defined by the appended claims rather than by the description preceding them, all changes that fall within the meets and bounds of the claims, or equivalence of such meets and bounds, are intended to be embraced by the claims.

What is claimed is:

1. A static random access memory including flip-flops arranged as memory cells in an array including a plurality of rows and row selecting means, comprising:
   power supply lines for said flip-flops, the power supply lines for flip-flops positioned in the same row being connected in common with each other,
   a common power supply line connected to said power supply lines for said flip-flops,
   means providing a signal having at least two distinct binary states to said common power supply line, and said common power supply line being coupled as a row selecting signal to said row selecting means.

2. A static random access memory including flip-flops arranged as memory cells in an array including a plurality of rows, comprising:
   a power supply line on which a predetermined voltage is applied;
   a row selecting circuit provided at each row;
   a common power supply line for each row connected to said row selecting circuit as a power supply line for each memory cell positioned in the same row;
   a logic circuit provided at each of a plurality of predefined blocks of memory cells positioned in the same row and having one input connected to the output of said row selecting circuit, and another input connected to receive a block selecting signal, and an output connected as to provide a word line signal in common to each memory cell in a block, and
   a clamping circuit means provided to each row, and connected between said power supply line and the output of said row selecting circuit in each row, for clamping the lowest voltage level output of said row selecting circuit at a voltage exceeding the lowest value of voltage enabling data retention within said memory cells.

3. A static random access memory as set forth in claim 2, wherein said logic circuit is an NOR circuit.

4. A static random access memory as set forth in claim 2, wherein said logic circuit is an AND circuit.

5. A static random access memory as set forth in claim 2, wherein said memory cell comprising:
   two storage transistors each connected in series with a load resistance between said power supply line for said memory cell and a ground potential, and
   two selecting transistors each including a control terminal and a pair of connection terminals, one of the connection terminals being connected to a node defined by the connection between a load resistance and the serially connected transistor and the other connection terminal serving as a connection point for a bit selecting signal line, and the control terminal being connected to receive the respective word line signal.

6. In a static random access memory of the type including a plurality of flip-flops arranged in array as memory cells, said array including a plurality of rows of flip-flops, each flip-flop having a control terminal means for receiving a signal to control writing to and reading from the flip-flop, and power terminal means for receiving operating power for the flip-flop, and a word line carrying a signal which assumes two distinct ranges of levels defined as logical 1 and logical 0, each word line being coupled to the control inputs of the flip-flops in a respective row of said memory, the improvement comprising said word line being also connected to the power inputs of said flip-flops defining the corresponding row.

7. A static random access memory including flip-flops arranged as memory cells in an array including a plurality of rows, comprising:
   power supply lines for said flip-flops, the power supply lines for flip-flops positioned in the same row being connected in common with each other,
   a common power supply line connected to said power supply lines for said flip-flops;
   means providing binary voltages to said common power supply line, one voltage level thereof being defined as a logical 1 state and being provided to said power supply lines for said flip-flops as the power thereof, the other voltage level, which is lower than said one voltage, being the other logical state, and
   means which recognizes said other logical state as a row selecting signal.

* * * * *